United States Patent
Narita et al.

(10) Patent No.: US 11,965,911 B2
(45) Date of Patent: Apr. 23, 2024

(54) INSPECTION APPARATUS HAVING A CONTACTOR FOR INSPECTING ELECTRICAL CHARACTERISTICS OF AN OBJECT, A CONTACTOR TIP POSITION ADJUSTING UNIT, AND A POSITION ADJUSTING METHOD THEREFOR

(71) Applicant: KABUSHIKI KAISHA NIHON MICRONICS, Tokyo (JP)

(72) Inventors: Satoshi Narita, Tokyo (JP); Jun Shirato, Tokyo (JP)

(73) Assignee: KABUSHIKI KAISHA NIHON MICRONICS, Tokyo (JP)

( * ) Notice: Subject to any disclaimer, the term of this patent is extended or adjusted under 35 U.S.C. 154(b) by 7 days.

(21) Appl. No.: 17/824,171

(22) Filed: May 25, 2022

(65) Prior Publication Data
US 2023/0003764 A1    Jan. 5, 2023

(30) Foreign Application Priority Data
Jul. 1, 2021   (JP) ................................. 2021-109928

(51) Int. Cl.
*G01R 1/067*   (2006.01)
*G01B 7/00*   (2006.01)
*G01R 31/26*   (2020.01)

(52) U.S. Cl.
CPC ......... *G01R 1/06794* (2013.01); *G01B 7/003* (2013.01); *G01R 1/06727* (2013.01); *G01R 31/2601* (2013.01)

(58) Field of Classification Search
CPC ........................... G01B 7/003; G01R 1/06711; G01R 1/06727; G01R 1/06794; G01R 31/2601;
(Continued)

(56) References Cited

U.S. PATENT DOCUMENTS 4,219,771 A * 8/1980 Reid .................. G01R 31/2886
324/750.19
4,328,553 A * 5/1982 Fredriksen ........... B28D 5/0082
125/35
(Continued)

FOREIGN PATENT DOCUMENTS

JP      2003-142536 A    5/2003
TW      M486056 U        9/2014
(Continued)

OTHER PUBLICATIONS

OA and Search Results cited in corresponding Taiwan Patent Appln. No. 111 120 017 dated Jul. 19, 2023.

*Primary Examiner* — Vinh P Nguyen
(74) *Attorney, Agent, or Firm* — BACON & THOMAS, PLLC

(57) ABSTRACT

An inspection apparatus makes an inspection of electrical characteristics of an object to be inspected using a contactor brought into electrical contact with an electrode of the object to be inspected, the inspection apparatus including: a position adjusting unit including the contactor, a position adjusting section that adjusts a tip position of the contactor, and a load detecting section that detects a value of contact load between the contactor and the electrode; a position deriving section that derives an initial position of the contactor in a specific direction based on a relationship between an amount of contact displacement of the contactor in the specific direction and the value of contact load between the contactor and the electrode; and a movement performing section that moves the tip position of the contactor based on the initial position in the specific direction derived by the position deriving section.

9 Claims, 8 Drawing Sheets

(58) Field of Classification Search
CPC ............ G01R 31/2887; G01R 31/2889; G01R 31/2891
See application file for complete search history.

(56) References Cited

U.S. PATENT DOCUMENTS

| | | | | |
|---|---|---|---|---|
| 4,758,785 | A * | 7/1988 | Rath | G01R 1/06794 |
| | | | | 324/756.01 |
| 7,304,486 | B2 * | 12/2007 | Petersen | G01R 27/14 |
| | | | | 324/750.16 |
| 7,323,861 | B2 * | 1/2008 | Bucksch | G01R 31/2889 |
| | | | | 324/750.02 |
| 8,836,358 | B2 * | 9/2014 | Baekbo | G01R 1/073 |
| | | | | 324/750.22 |
| 8,963,567 | B2 * | 2/2015 | Edwards | G01R 1/06794 |
| | | | | 324/754.1 |
| 9,261,532 | B1 * | 2/2016 | Kim | G01Q 60/40 |
| 2006/0006891 | A1 | 1/2006 | Romanov et al. | |
| 2015/0145544 | A1 | 5/2015 | Edwards et al. | |

FOREIGN PATENT DOCUMENTS

| | | |
|---|---|---|
| TW | 201608250 A | 3/2016 |
| TW | M587276 U | 12/2019 |
| TW | M611398 U | 5/2021 |

\* cited by examiner

INSPECTION APPARATUS HAVING A CONTACTOR FOR INSPECTING ELECTRICAL CHARACTERISTICS OF AN OBJECT, A CONTACTOR TIP POSITION ADJUSTING UNIT, AND A POSITION ADJUSTING METHOD THEREFOR

CROSS-REFERENCE TO RELATED APPLICATIONS

The present application claims, under 35 USC 119, priority of Japanese Patent Application No. 2021-109928 filed on Jul. 1, 2021.

Technical Field

The present disclosure relates to an inspection apparatus, a position adjusting unit, and a position adjusting method and can be applied to, for example, an inspection apparatus that makes an inspection of the electrical characteristics of a semiconductor integrated circuit on a semiconductor wafer.

Background Art

There is an inspection apparatus that makes an individual inspection of the electrical characteristics of a particular device of semiconductor integrated circuits (devices) formed on a semiconductor wafer, for example (see PTL 1).

There are various types of this kind of inspection apparatus. As illustrated in FIGS. 5 and 6, there is an inspection apparatus including a position adjusting unit that allows an operator to manually make fine adjustments of the tip position of a probe.

As illustrated in FIG. 7, a position adjusting unit 9 of a conventional inspection apparatus includes an X knob 91 by which fine adjustments of the X-direction position of a probe 97 are made, a Y knob 92 by which fine adjustments of the Y-direction position of the probe 97 are made, and a Z knob 93 by which fine adjustments of the Z-direction position of the probe 97 are made. An operator makes fine adjustments of the position of the probe 97 in such a way that the tip of the probe 97 makes contact with an electrode pad of a device by manipulating the X knob 91, the Y knob 92, and the Z knob 93.

Hereinafter, a method of making initial settings of a probe position with respect to an electrode pad of a device will be briefly described with reference to FIGS. 8A-1 to 8B-2.

First, the operator recognizes an electrode pad 80 of a device and the probe 97 using a microscope, a camera or the like. The operator makes position adjustments of the probe 97 in an XY plane by manipulating the X knob 91 and the Y knob 92 (see FIGS. 8A-1 and 8A-2).

For example, FIGS. 8A-1 and 8A-2 are plan views of a top surface of the electrode pad 80 viewed from above. When the tip position of the probe 97 is not positioned roughly in the center of the electrode pan 80 (see FIG. 8A-1), the operator moves the tip of the probe 97 in a two-dimensional direction by manipulating the X knob 91 and the Y knob 92, such that the tip position of the probe 97 lies in a nearly center position of the electrode pad 80 (see FIG. 8A-2).

Next, the operator lowers the tip position of the probe 97 in a Z direction by manipulating the Z knob 93. In doing so, the operator lowers the tip position of the probe 97 until the tip of the probe 97 makes contact with the electrode pad 80 (see FIG. 8B-1). Furthermore, the operator gradually lowers the position of the probe 97 by manipulating the Z knob 93 until the tip of the probe 97 slides on the surface of the electrode pad 80 (see FIG. 8B-2).

CITATION LIST

Patent Literature

PTL 1: JP-A-2003-142536

SUMMARY OF INVENTION

Technical Problem

A wiring pattern and an electrode pad of a device on a semiconductor wafer are becoming increasingly finer and the degree of difficulty of position adjustments of a probe that gives and receives an electrical signal is also becoming increasingly higher proportionately. This results in the need for an inspection apparatus that can make position adjustments of the probe with a high degree of precision by an easier manipulation method than before.

However, as described above, a probe position initial setting method completely depends on operator's senses and, for Z-direction position adjustments of the probe in particular, the operator is required to grasp movements of about a few micrometers (μm).

For example, Z-direction position adjustments of the probe that are not properly made could cause damage to the probe or damage to the electrode pad and also affect the inspection quality of the device.

Thus, instead of a manipulation method depending on operator's senses, an inspection apparatus, a position adjusting unit, and a position adjusting method that can make initial position adjustments of a probe with respect to an electrode pad with a high degree of precision are needed.

Solution to Problem

To solve this problem, a first disclosure is an inspection apparatus that makes an inspection of electrical characteristics of an object to be inspected using a contactor brought into electrical contact with an electrode of the object to be inspected, the inspection apparatus including: (1) a position adjusting unit including the contactor, a position adjusting section that adjusts a tip position of the contactor, and a load detecting section that detects a value of contact load between the contactor and the electrode; (2) a position deriving section that derives an initial position of the contactor in a specific direction based on a relationship between an amount of contact displacement of the contactor in the specific direction and the value of contact load between the contactor and the electrode; and (3) a movement performing section that moves the tip position of the contactor based on the initial position in the specific direction derived by the position deriving section.

A second disclosure is a position adjusting unit that adjusts a tip position of a contactor that is brought into electrical contact with an electrode of an object to be inspected, the position adjusting unit including: (1) a position adjusting section that adjusts the tip position of the contactor; (2) a load detecting section that detects a value of contact load between the contactor and the electrode; (3) a position deriving section that derives an initial position of the contactor in a specific direction based on a relationship between an amount of contact displacement of the contactor in the specific direction and the value of contact load between the contactor and the electrode; and (4) a movement performing section that moves the tip position of the contactor based on the initial position in the specific direction derived by the position deriving section.

A third disclosure is a position adjusting method by which a tip position of a contactor that is brought into electrical contact with an electrode of an object to be inspected is adjusted by a position adjusting unit including the contactor, a position adjusting section that adjusts the tip position of the contactor, and a load detecting, section that detects a value of contact load between the contactor and the electrode, (1) wherein a position deriving section derives an initial position of the contactor in a specific direction based on a relationship between an amount of contact displacement of the contactor in the specific direction and the value of contact load between the contactor and the electrode, and (2) wherein a movement performing section moves the tip position of the contactor based on the initial position in the specific direction derived by the position deriving section.

Advantageous Effects of Invention

According to the present disclosure, it is possible to make initial position adjustments of a probe with respect to an electrode pad with a high degree of precision.

BRIEF DESCRIPTION OF DRAWINGS

FIGS. 8A-1 and 8A-2 are plan views showing the manner, viewed from above, in which a probe is brought into contact with an electrode pad in the conventional inspection apparatus and FIGS. 8E-1 and 8E-2 are side views showing the manner viewed from the side.

DESCRIPTION OF EMBODIMENTS (A) Embodiment

Hereinafter, an embodiment of an inspection apparatus, a position adjusting unit, and a position adjusting method according to the present disclosure will be described in detail with reference to the drawings.

(A-1) Configuration of Embodiment (A-1-1) Inspection Apparatus

An inspection apparatus according to this embodiment basically has the same configuration as the existing inspection apparatus or a configuration equivalent to the existing inspection apparatus. Thus, the configuration of the inspection apparatus will be described using FIGS. 5 and 6 also in this embodiment.

Figure 5:
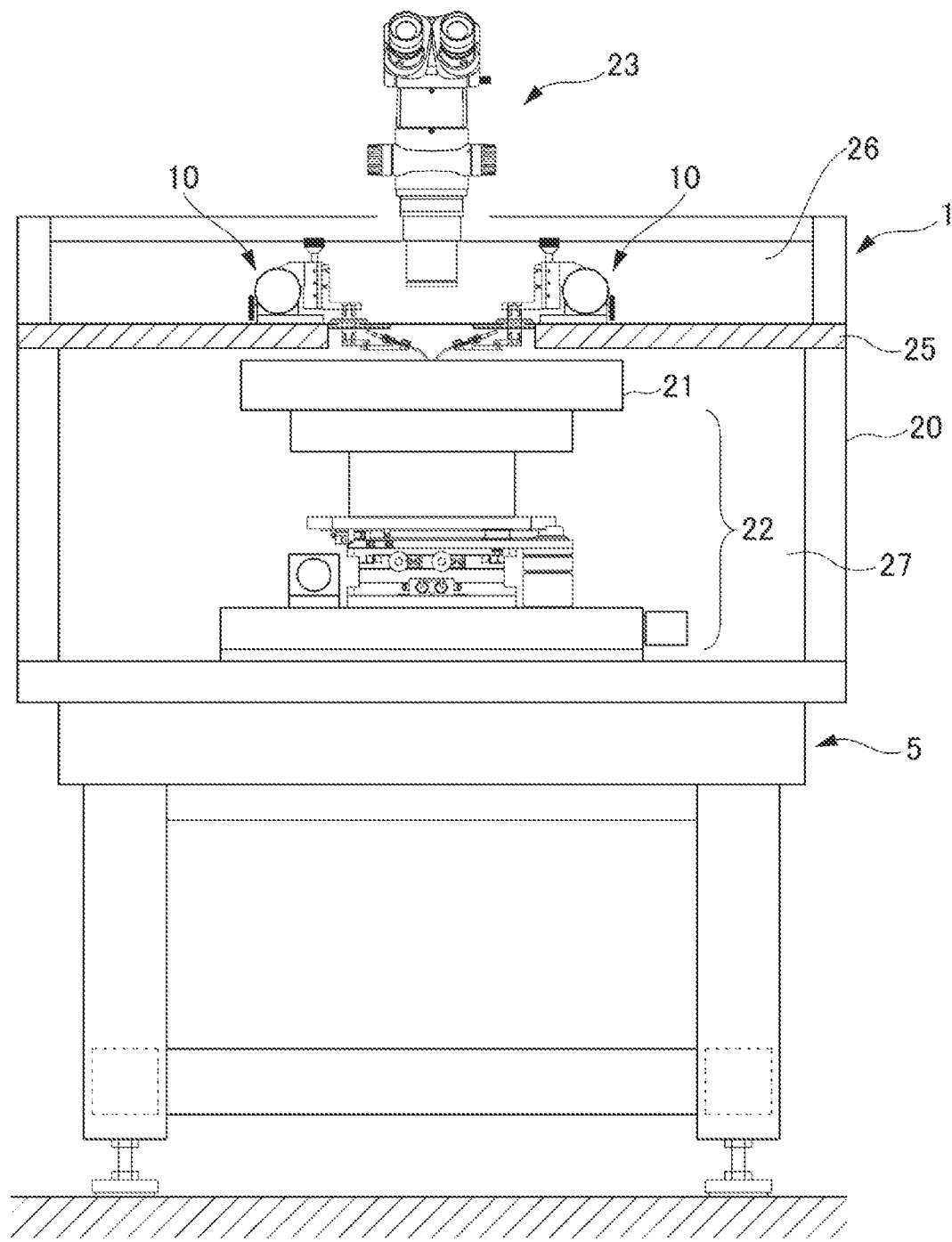
FIG. 5 is a configuration diagram showing the external schematic configuration of an inspection apparatus according to the embodiment.
Figure 6:
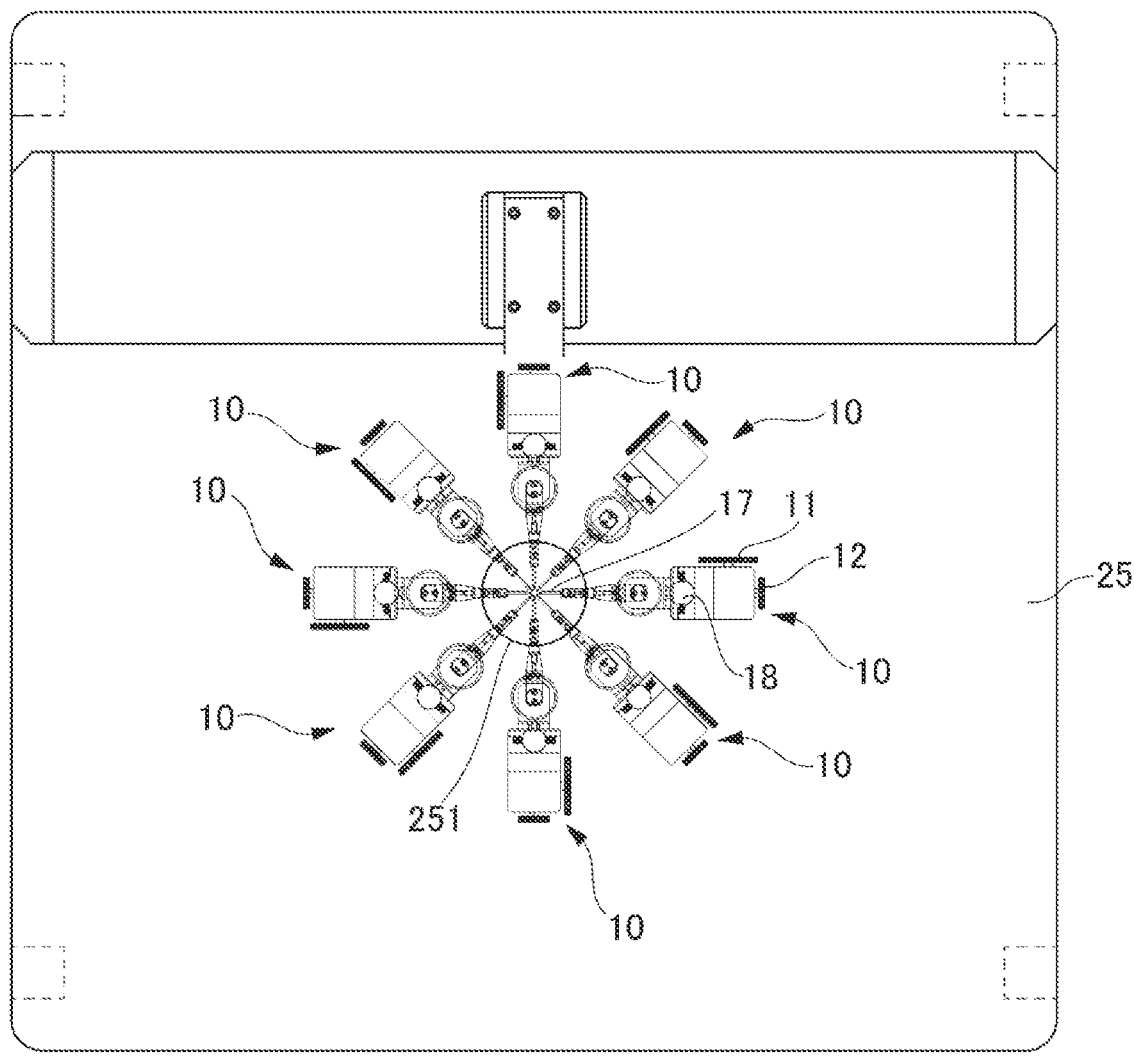
FIG. 6 is a plan view of the position adjusting unit, which is viewed from above, of the inspection apparatus according to the embodiment.
Figure 7:
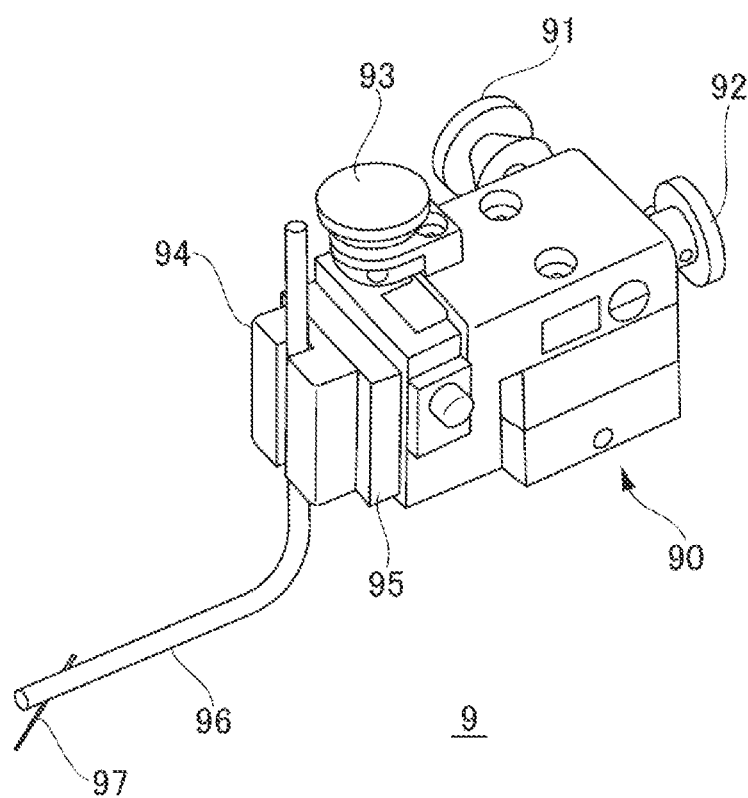
FIG. 7 is a configuration diagram showing the configuration of a position adjusting unit mounted in a conventional inspection apparatus.
Figures 2, 8B:
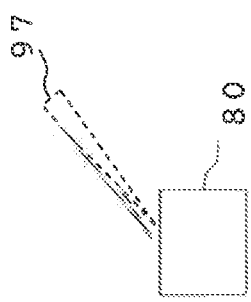
Figures 1, 8B:
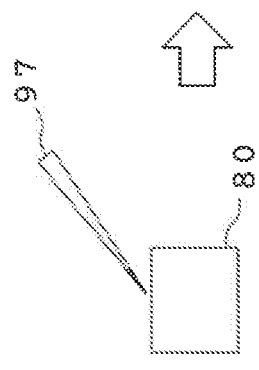
Figures 2, 8A:
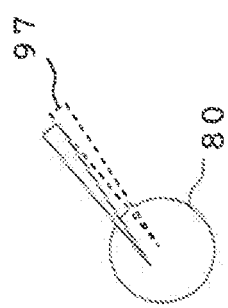
Figures 1, 8A:
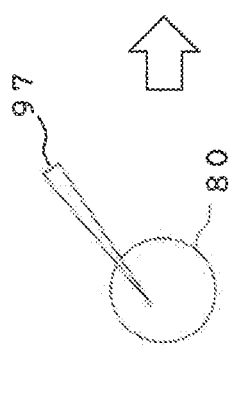

FIG. 5 is a configuration diagram showing the schematic configuration of the inspection apparatus according to the embodiment. FIG. 6 is a plan view of the position adjusting unit, which is viewed from above, of the inspection apparatus according to the embodiment.

In FIG. 5, an inspection apparatus 1 according to the embodiment includes a housing 20 and, in the housing 20, a plurality of position adjusting units 10, a stage 21, and a stage driving section 22. Furthermore, the inspection apparatus 1 includes a microscope 23.

The inspection apparatus 1 makes an inspection of the electrical characteristics of a semiconductor integrated circuit (a device) formed on a semiconductor wafer placed on a top surface of the stage 21.

FIG. 5 shows a state in which many of the components of the inspection apparatus 1 are accommodated in the housing 20 and the housing 20 of the inspection apparatus 1 is placed on a workbench 5.

The housing 20 of the inspection apparatus 1 has space inside and a plate member 25 is provided inside the housing 20. The housing 20 is partitioned by the plate member 25 into an upper portion 26 which is upper internal space and a lower portion 27 which is lower internal space.

The stage 21 on which the semiconductor wafer is placed and the stage driving section 22 that drives the stage 21 are provided in the lower portion 27 of the housing 20. Moreover, the plurality of position adjusting units 10 are provided in the upper portion 26 of the housing 20.

A circular opening 251 is provided in the plate member 25 provided inside the housing 20 and the plurality of position adjusting units 10 are placed at the peripheral edge of the opening 251. As illustrated in FIG. 6, each position adjusting unit 10 can bring a probe 17 into electrical contact with an electrode pad of a device of the semiconductor wafer placed on the stage 21 through the opening 251.

Before making an inspection, the inspection apparatus 1 makes initial position adjustments (first contact) of the probe 17 to bring the probe 17 of each position adjusting unit 10 into electrical contact with the electrode pad of the device on the semiconductor wafer.

The inspection apparatus 1 includes the microscope 23 to allow an operator to visually identify the microscopic device on the semiconductor wafer. In place of or in addition to the microscope 23, the inspection apparatus 1 may include a camera (an imaging device) such as a CCD camera and display an image taken by the camera on a display section such as a display.

At the time of an inspection, the inspection apparatus 1 provides an electrical signal to the electrode pad of the device via the probe 17 of the position adjusting unit 10. On the other hand, when the device outputs an electrical signal, the electrical signal is provided to the inspection apparatus 1 via the probe 17. The inspection apparatus 1 makes an inspection of the electrical characteristics of the device based on, for example, the value of the electrical signal to the device and/or the value of the electrical signal from the device.

(A-1-2) Position Adjusting Unit

Figure 1:
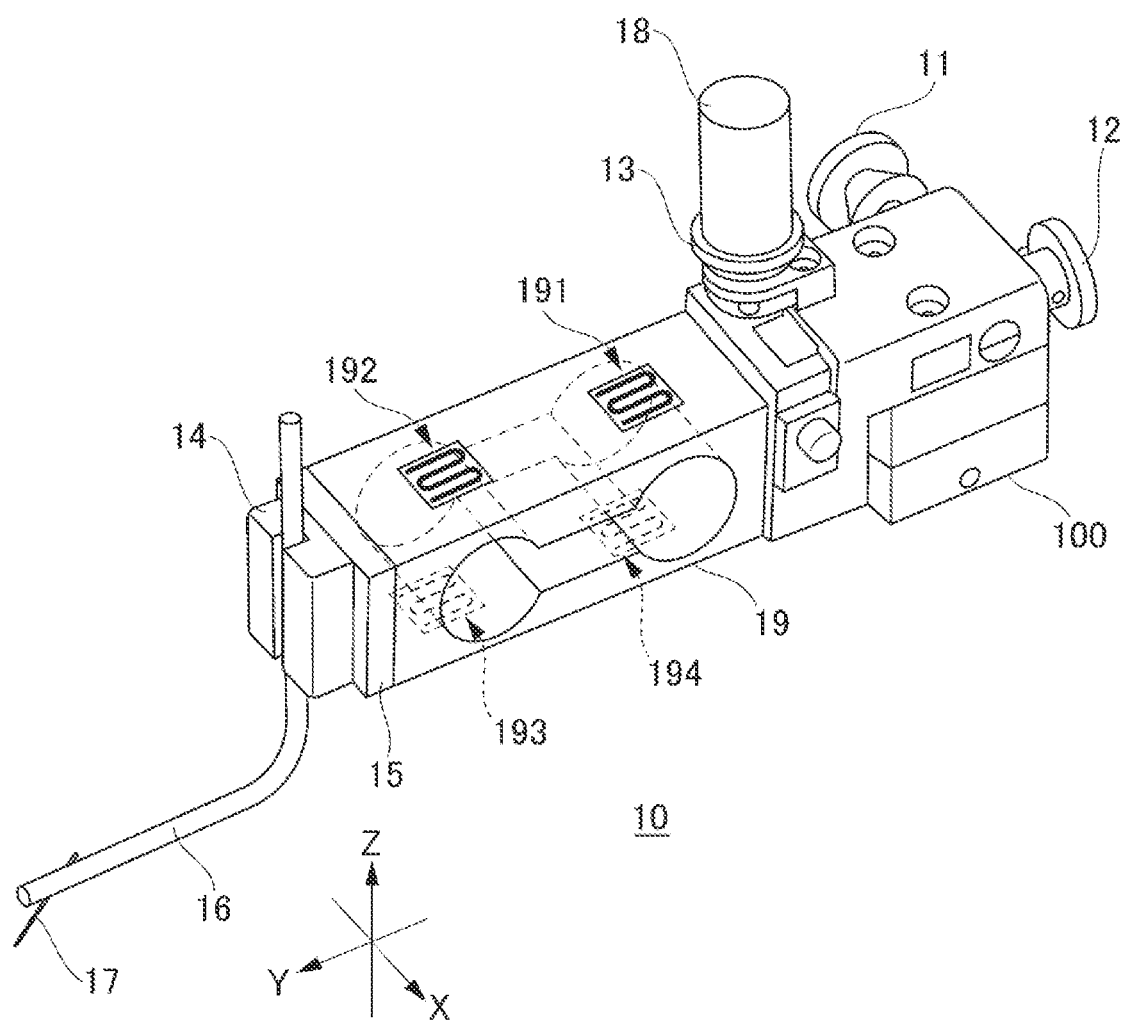
FIG. 1 is a configuration diagram showing the configuration of a position adjusting unit according to an embodiment.

FIG. 1 is an external perspective view showing the configuration of the position adjusting unit 10 according to the embodiment.

In FIG. 1, the position adjusting unit 10 includes a main body 100, an X-direction position adjusting section (hereinafter referred to as an "X knob") 11, a Y-direction position adjusting section (hereinafter referred to as a "Y knob") 12, a Z-direction position adjusting section (hereinafter referred to as a "Z knob") 13, a Z knob driving section 18, a load converter 19, an isolator 15, an arm supporting section 14, an L arm section 16, and the probe 17.

The position adjusting unit 10 brings the probe 17 into electrical contact with the electrode pad of the device on the semiconductor wafer by adjusting the position of a cantilever type probe provided with the linear probe 17 at the tip of the L arm section 16. The position adjusting unit 10 is also called a manipulator because the position adjusting unit 10 adjusts the position of the probe 17 by being manipulated by the operator.

The position adjusting unit 10 is not limited to the configuration illustrated in FIG. 1 as long as the position adjusting unit 10 includes a cantilever type probe. For example, a linear arm section may be provided in place of the L arm section 16 and the linear arm section may support the probe 17. In either case, the position adjusting unit 10 adjusts the position of a cantilever type probe.

The probe 17 is formed of a conductive material and is a contactor that makes electrical contact with the surface of the electrode pad of the device. The probe 17 is a linear contactor, and one end of the probe 17 is supported by the L arm section 16 and the other end (also referred to as "the tip portion") of the probe 17 makes contact with the electrode pad. Thus, the probe 17 is a cantilever type probe.

The L arm section 16 is a supporting member that supports the probe 17. The L arm section 16 is formed of a conductive material, and one end (for example, a lower end) of the L arm section 16 supports the probe 17 and the other end (for example, an upper end) connects to wiring (not shown in FIG. 1) that transmits and receives an electrical signal to and from the inspection apparatus 1.

The arm supporting section 14 is a member that supports the L arm section 16. In this example, the arm supporting section 14 is provided at one end of the isolator 15. For example, the arm supporting section 14 has a groove portion that supports a member, which extends in a vertical direction (a Z direction), of the L arm section 16, and supports the L arm section 16 by the groove portion into which the member extending in the vertical direction is fitted.

The isolator 15 is formed of an insulating material. The isolator 15 is interposed between the arm supporting section 14 and the load converter 19 to prevent electrical current from being applied to the load converter side and the main body 100 side at the time of an inspection.

The load converter 19 converts the amount of load (a load value) acting on the cantilever type probe 17 to an electrical signal and provides the signal value thereof to a control section 243 of the inspection apparatus 1.

The load converter 19 only has to measure the amount of force (the amount of load) which is exerted when the tip of the cantilever type probe 17 is in contact with the electrode pad; for example, a load cell or the like that detects a load can be applied to the load converter 19. The load converter 19 is provided between the main body 100 and the L arm section 16.

For example, as illustrated in FIG. 1, the load converter 19 as a load cell includes two strain gages 191 and 192 on the top side and two load strain gages 193 and 194 on the underside. When the load converter 19 is deformed (for example, warps) by pressure which is applied thereto when the probe 17 makes contact with the electrode pad, the strain gages 191 to 194 are also deformed, which causes the resistance values of the strain gages 191 to 194 to change. Thus, when an input voltage is applied to the load converter 19, voltages responsive to change in the resistance values of the strain gages 191 to 194 are output. Therefore, the amount of force which is exerted when the probe 17 makes contact with the electrode pad is measured based on the values of the output voltages from the load converter 19.

The X knob 11, the Y knob 12, and the Z knob 13 are adjustment knobs of a position adjusting mechanism that makes fine adjustments of the tip position of the probe 17. The X knob 11 is an adjustment knob of an X-direction fine adjustment mechanism and the Y knob 12 is an adjustment knob of a Y-direction fine adjustment mechanism.

The Z knob 13 is an adjustment knob of a Z-direction fine adjustment mechanism and is driven by receiving the driving force from the Z knob driving section 18 such as a motor. That is, the X knob 11 and the Y knob 12 are manually manipulated by the operator as in the case of the conventional position adjusting unit and the Z knob 13 is automatically operated by the Z knob driving section 18. In other words, the position adjusting unit 10 automatically makes fine adjustments of at least the Z-direction position of the probe 17.

Figure 2:
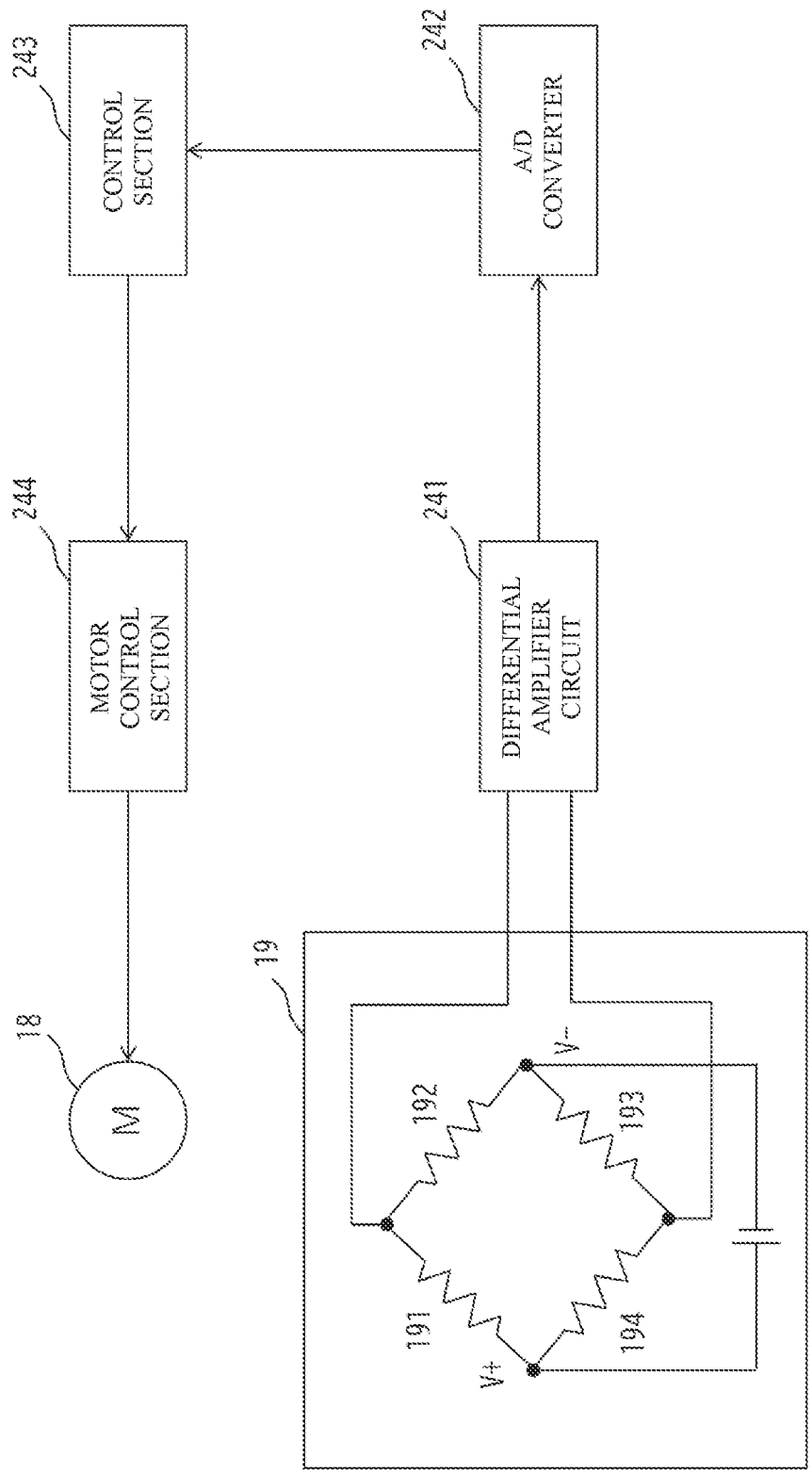
FIG. 2 is a configuration diagram showing the configuration of Z-direction fine adjustment processing in the embodiment.

FIG. 2 is a configuration diagram showing the configuration of Z-direction fine adjustment processing in the embodiment.

In FIG. 2, the configuration of the Z-direction fine adjustment processing includes the load converter 19, a differential amplifier circuit 241, an A/D converter 242, the control section 243, a motor control section 244, and the Z knob driving section 18.

An input voltage is applied to the load converter 19, the resistance values of the strain gages 191 to 194 change due to deformation thereof, and the load converter 19 outputs output voltages that can vary in response to the change in the resistance values.

The differential amplifier circuit 241 receives an input of the two voltage values that are output from the load converter 19, amplifies the value of difference between the two voltage values by differential gain, and outputs the obtained value to the A/D converter 242.

The A/D converter 242 converts the output value (an analog signal) from the differential amplifier circuit 241 to a digital signal and provides the digital signal to the control section 243.

The control section 243 controls the amount of Z-direction displacement of the probe 17 based on the load value output from the load converter 19. A device including a CPU, ROM, RAM, EEPROM, an input/output interface and so forth can be applied to the control section 243. The control section 243 implements the Z-direction fine adjustment processing by the CPU executing a processing program (for example, a Z-direction adjustment program) stored in the ROM.

A Z-direction fine adjustment method that is performed by the control section 243 when the probe 17 makes first contact will be described in detail in the section on an operation. The control section 243 has a function as a position deriving section that derives a Z-direction initial setting position.

The motor control section 244 performs driving control of the Z knob driving section 18 under control of the control section 243. A method of controlling the motor control section 244 will also be described in detail in the section on an operation.

A motor or the like, for example, can be applied to the Z knob driving section 18 and the Z knob driving section 18 drives the Z knob 13 under control of the motor control section 244. The Z knob driving section 18 drives the Z knob 13 and thereby moves the Z-direction position of the probe 17.

(A-2) Operation of Embodiment

Next, a processing operation that is performed by the position adjusting unit 10 according to the embodiment to make initial settings of the position of the probe 17 will be described with reference to the drawings.

Figure 3:
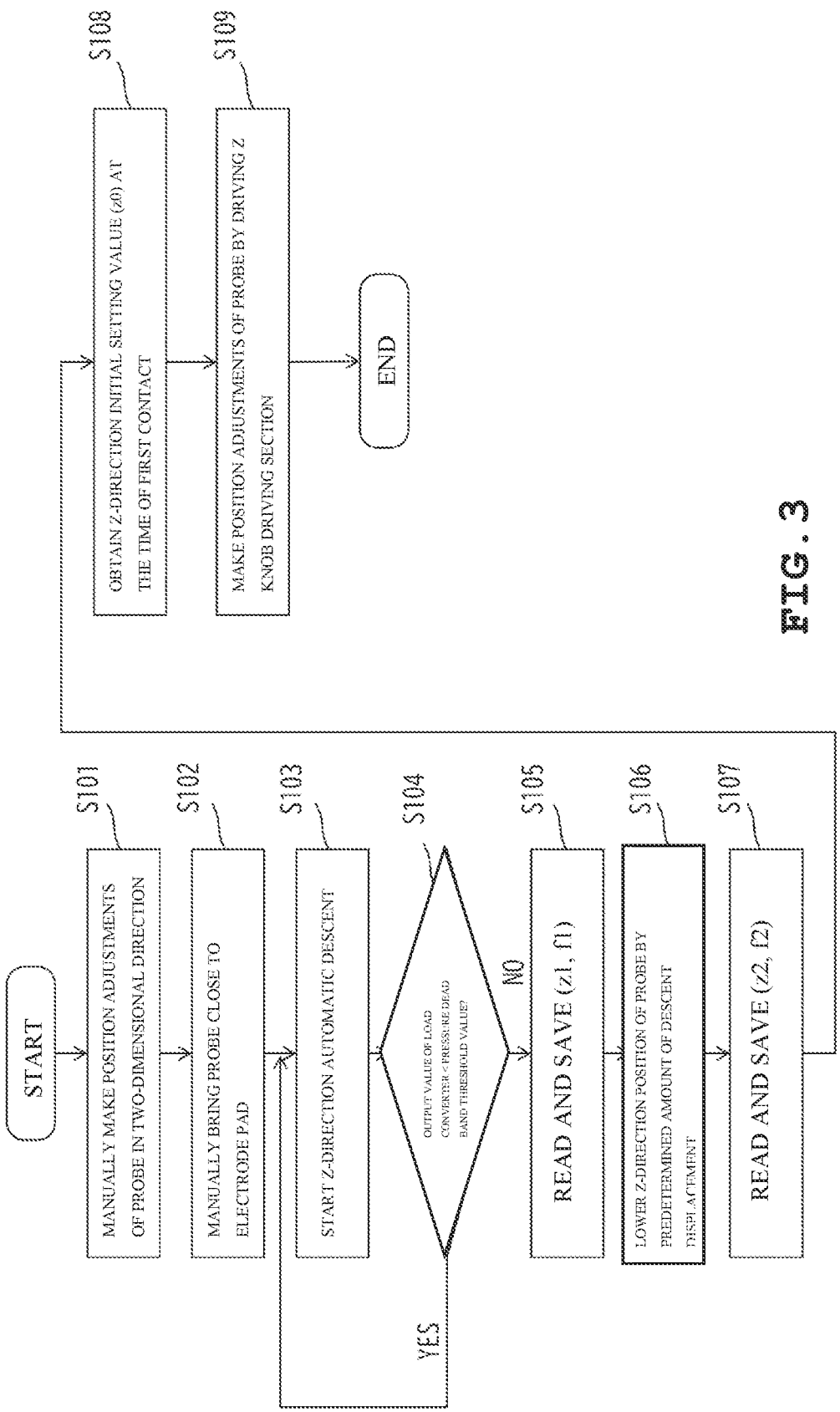
FIG. 3 is a flowchart showing a probe position initial setting processing operation that is performed by the position adjusting unit according to the embodiment.
Figure 4:
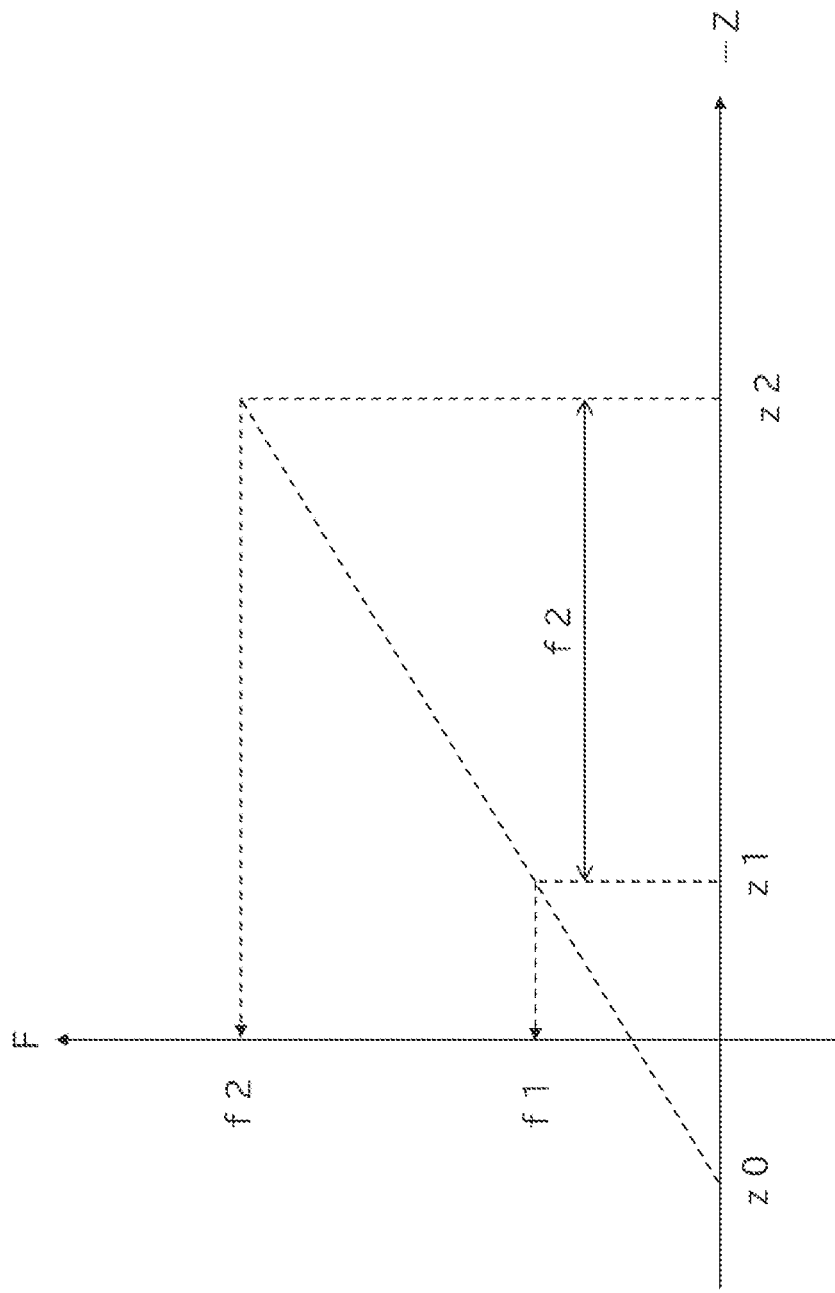
FIG. 4 is a relationship diagram showing the relationship between the output value of a load converter and the amount of Z-direction displacement of a probe in the embodiment.

FIG. 3 is a flowchart showing the processing operation that is performed by the position adjusting unit 10 according to the embodiment to make initial settings of the position of the probe 17. FIG. 4 is a relationship diagram showing the relationship between the output value of the load converter 19 and the amount of Z-direction displacement of the probe 17.

A semiconductor wafer as an object to be inspected is placed on the stage 21 and the operator adjusts the position of the stage 21 to a proper position by manipulating the stage driving section 22.

The operator looks into the microscope 23 and recognizes an electrode pad of a device on the semiconductor wafer and the probe 17. Then, the operator makes position adjustments such that the tip position of the probe 17 is positioned roughly in the center of the electrode pad by moving the probe 17 in a two-dimensional direction in an XY plane by manipulating the X knob 11 and the Y knob 12 (S101).

When finishing position adjustments of the probe 17 in the two-dimensional direction, the operator lowers the probe 17 in a Z direction by manipulating the Z knob 13 and brings the tip of the probe 17 close to the electrode pad (S102). The process of S102 is manually performed by the operator to make efficient position adjustments of the probe 17; however, the process of S102 may also be automatically performed.

Next, when, for example, the operator turns ON a setting start switch or the like, processing for making initial settings of the Z-direction position of the probe 17 is started.

A voltage of a predetermined value is being applied to the load converter 19, which allows the load converter 19 to detect a load.

The control section 243 provides the motor control section 244 with an instruction to lower the probe 17 in the Z direction. In response to this instruction, the motor control section 244 starts lowering the probe 17 in the Z direction by driving the Z knob driving section 18 (S103).

In doing so, for example, the motor control section 244 lowers the probe 17 in the Z direction by 1 micrometer at a time. The control section 243 compares the output voltage value of the load converter 19 that detects contact load between the probe 17 and the electrode pad with a preset pressure dead band threshold value (S104).

Then, if the output voltage value is less than the pressure dead band threshold value (S104/YES), the processing goes back to S103 and the control section 243 continues to provide the motor control section 244 with an instruction to lower the probe 17 in the Z direction. On the other hand, if the output voltage value is more than or equal to the pressure dead band threshold value (S104/NO), the processing proceeds to S105.

A pressure dead band refers to an area where the tip of the descending probe 17 is assumed to be in unstable contact with the surface of the electrode pad; that is, in this state, it cannot be said that the probe 17 is in contact with the electrode pad with reliability, and the pressure (reaction force) by contact load is also unstable.

Thus, by using the pressure dead band threshold value based on which it is assumed that the probe 17 has gotten out of the pressure dead band, it is judged that the pressure (the reaction force by contact load) is low and a contact state is unstable when the output voltage value of the load converter 19 is less than the pressure dead band threshold value. Conversely, when the output voltage value of the load converter 19 is more than or equal to the pressure dead band threshold value, it is assumed that the pressure is somewhat high and the probe 17 is in contact with the electrode pad with reliability.

In S103 and S104, to exclude an unstable contact state, the probe 17 is gradually lowered and the output voltage value of the load converter 19 is compared with the pressure dead band threshold value, whereby a state in which the probe 17 is in contact with the electrode pad with reliability is detected.

Moreover, an operation of the motor control section 244 and the Z knob driving section 18 will be briefly described. For example, when the Z knob driving section 185 is a stepping motor, the motor control section 244 outputs, to the Z knob driving section 18, a pulse signal proportional to the angle of rotation of the Z knob driving section 18 corresponding to the amount of rotation of the Z knob 13 that lowers the probe 17 by 1 micrometer at a time. This makes it possible to gradually lower the probe 17 such as lowering the probe 17 by 1 micrometer at a time.

In S105, when the output voltage value of the load converter 19 is more than or equal to the pressure dead band threshold value, the control section 243 reads the amount of displacement (z1 of FIG. 4) of the probe 17 lowered in the Z direction and the output value (f1 of FIG. 4) of the load converter 19 and saves (z1, f1) (S105).

Next, the control section 243 further lowers the Z-direction position of the probe 17 by a predetermined amount of descent displacement (for example, 50 μm) (S106). For example, after saving the value of the amount of displacement z1 of the probe 17, the control section 243 resets the amount of displacement of the probe 17 to zero. Then, the control section 243 sets a preset value of the amount of descent displacement and provides the motor control section 244 with an instruction to lower the probe 17 by the amount of descent displacement. The motor control section 244 lowers the probe 17 by the amount of descent displacement by driving the Z knob driving section 18.

Then, the control section 243 reads the amount of displacement (z2 of FIG. 4) of the probe 17 lowered by the predetermined amount of descent displacement and the output value (f2 of FIG. 4) output from the load converter 19 at the time and saves (z2, f2) (S107).

Next, the control section 243 substitutes (z1, f1) and (z2, f2) into formula (1) and derives the Z-direction initial setting value z0 of the probe 17 for the electrode pad S108).

$$z0 = z1 - f1/[(f2-f1)/(z2-z1)] \quad (1)$$

The following is the explanation of formula (1). In formula (1), $[(f2-f1)/(z2-z1)]$ indicates the amount of change in load per unit amount of Z-direction displacement. In the case of a cantilever type probe, the relationship between the amount of Z-direction displacement and the reaction force (the amount of change in load) is a proportional relationship; therefore, the amount of change in load per unit amount of Z-direction displacement is determined using the above characteristics.

The position of the probe 17 is lowered by the predetermined amount of descent displacement in S106 in order to determine the relationship (the proportional relationship) between the amount of Z-direction displacement and the reaction force (the amount of change in load). Therefore, any value can be used as the value of the amount of descent displacement by which the probe 17 is lowered.

Moreover, the relationship between the amount of Z-direction displacement and the reaction force (the amount of change in load) makes it necessary for the probe 17 to be in contact with the electrode pad with stability. For this reason, in order to exclude an unstable contact state of the probe 17, it is judged in S103 and S104 that the probe 17 is in contact with the electrode pad with stability if the output voltage value of the load converter 19 is more than or equal to the pressure dead band threshold value.

When the Z-direction initial setting value z0 of the probe 17 is derived, the control section 243 provides the motor control section 244 with an instruction to lower the probe 17 to the Z-direction initial setting value. In response to this instruction, the motor control section 244 operates the Z knob driving section 18 and the Z knob driving section 18 turns the Z knob 13, whereby the probe 17 is lowered to the Z-direction initial setting value z0 and initial position adjustments of the position of the probe 17 are made (S109).

As described earlier, the operator makes fine adjustments of the position of the probe 17 in the XY plane by manipulating the X knob 11 and the Y knob 12; then, as for the Z-direction position of the probe 17, the probe 17 automatically moves down to the initial setting position derived by the control section 243. This makes it possible to adjust the Z-direction initial setting position, which is first contact of the probe 17, with precision.

(A-3) Effects of Embodiment

As described above, according to this embodiment, by automatizing position adjustments of a probe which have depended on operator's individual senses, it is possible to make initial position adjustments of the probe with precision.

Moreover, according to this embodiment, since it is possible to automatically make position adjustments of the probe even when the stage (chuck) on which the semiconductor wafer is placed is inclined due to the movement thereof, it is possible to achieve stable contact with the same precision in any location.

Furthermore, according to this embodiment, since the relationship between the amount of Z-direction displacement and the reaction force (the amount of change in load) is obtained, the operator can automatically perform contact at any pressure or by any amount of probe overdrive.

(B) Other Embodiments

While various modifications have been mentioned in the above-described embodiment, the present disclosure can also be applied to the following modifications.

(B-1) The relationship between the amount of Z-direction displacement and the reaction force (the amount of change in load) can be derived using at least any two pairs of a Z-direction position and the value of a load (reaction force). Thus, a method is not limited to the method of the above-described embodiment as long as a method can obtain at least two or more pairs of a Z-direction position and a load (reaction force) value after the probe 17 makes contact with the electrode pad with stability.

In the above-described embodiment, for example, a case where the predetermined amount of descent displacement is 50 µm has been illustrated; the value of the amount of descent displacement is not limited to 50 µm and only has to be a value that allows the relationship between the amount of Z-direction displacement and the reaction force (the amount of change in load) to be obtained. It is desirable to determine the value of the amount of descent displacement with consideration given to the possibility that descent of the probe 17 may cause damage to an electrode pad or the probe 17.

Moreover, in the above-described embodiment, for example, a case where the Z-direction position z2 to which the probe 17 was lowered by the control section 243 by the amount of descent displacement and the load value f2 obtained at the time of the descent are obtained as a second pair of a Z-direction position and a load value has been illustrated; the embodiment is not limited to this case. For example, the control section 243 may lower the probe 17 until the output value from the load converter 19 reaches a predetermined load value and obtain a Z-direction position observed when the output value has reached the predetermined load value. The same effect as that of the above-described embodiment can be obtained also in this case because a second pair of a Z-direction position and a load value can be obtained.

The relationship between the amount of Z-direction displacement and the reaction force (the amount of change in load) can be obtained using at least two or more pairs of a Z-direction position and a load (reaction force) value; three or more pairs of a Z-direction position and a load (reaction force) value may be used to obtain the relationship between the amount of Z-direction displacement and the reaction force (the amount of change in load).

(B-2) The position adjusting method in the above-described inspection apparatus 1 may perform the processing illustrated in FIG. 3 at each inspection of the electrical characteristics of a device; alternatively, the position adjusting method does not have to perform the processing of FIG. 3 at each inspection if it can use the relationship, which was obtained in FIG. 3, between the amount of Z-direction displacement and the reaction force (the amount of change in load).

In other words, for each chip to be inspected, the value of change in load (the gradient of the proportional relationship between the amount of Z-direction displacement and the value of change in load) per unit length may be obtained by the processing of FIG. 3 or, if the obtained value of change in load per unit length can be used, fine adjustments of the Z-direction position of the probe 17 may be made using the obtained value of change in load per unit length.

For example, it is preferable to perform processing for obtaining a gradient for each chip to be inspected when, for example, the positional relationship between a probe position and a chip to be inspected changes after the probe position initial settings in the processing of FIG. 3 or a different type of chip to be inspected is subjected to an inspection. On the other hand, when, for example, the same type of chip is subjected to an inspection, the gradient can be used as it is; therefore, in this case, the Z-direction position of the probe 17 may be set without obtaining a gradient again.

(B-3) Formula (1) is a formula that derives the amount of change in load per unit length from (z1, f1) and (z2, f2) and derives the value of Z on the assumption that a proportional expression of the amount of change in load per unit length passes through a point (z1, f1) and F=0.

Formula (1) is one example and a formula is not limited thereto; a formula may be a formula that derives the value of Z on the assumption that a proportional expression of the amount of change in load per unit length passes through a point (z2, f2) and F=0.

REFERENCE SIGNS LIST 1 inspection apparatus
10 position adjusting unit
11 X knob
12 Y knob
13 Z knob
14 arm supporting section
15 isolator
16 L arm section
17 probe
18 Z knob driving section
19 load converter
20 housing
21 stage
22 stage driving section
23 microscope
25 plate member
26 upper portion
27 lower portion
80 electrode pad
100 main body
191 strain gage
192 strain gage
193 strain gage
194 strain gage
241 differential amplifier circuit
242 A/D converter
243 control section
244 motor control section
251 opening

The invention claimed is:

1. An inspection apparatus that makes an inspection of electrical characteristics of an object to be inspected using a contactor brought into electrical contact with an electrode of the object to be inspected, the inspection apparatus comprising:
a position adjusting unit including the contactor, a position adjusting section that adjusts a tip position of the contactor, and a load detecting section that detects a value of contact load between the contactor and the electrode;
a position deriving section that derives an initial position of the contactor in a specific direction based on a relationship between an amount of contact displacement of the contactor in the specific direction and the value of contact load between the contactor and the electrode; and
a movement performing section that moves the tip position of the contactor based on the initial position in the specific direction derived by the position deriving section,
wherein the position adjusting section adjusts a two dimensional position of the contactor relative to the electrode,
wherein, after the two dimensional position of the contactor is adjusted, the contactor is manually or automatically lowered towards the electrode until the contactor contacts the electrode, thereby causing displacement of the contactor in the specific direction,
wherein the position deriving section obtains at least two or more measurement results, including the amount of contact displacement of the contactor in the specific direction and the value of contact load obtained at the time, and derives the initial position of the contactor in the specific direction using a value of change in load per unit length, which was derived using the two or more measurement results, and
wherein the movement performing section performs a fine adjustment of the tip position of the contactor based on the initial position derived by the position deriving section.

2. The inspection apparatus according to claim 1,
wherein the contactor is a cantilever type contactor, and
wherein the position deriving section derives the initial position of the contactor in the specific direction based on a proportional relationship between the amount of contact displacement of the contactor in the specific direction and the value of contact load between the contactor and the electrode.

3. The inspection apparatus according to claim 1,
wherein the position adjusting section adjusts the two dimensional position of the contactor relative to the electrode by being manipulated by the operator while the operator views the electrode through a microscope or imaging device.

4. A position adjusting unit that adjusts a tip position of a contactor that is brought into electrical contact with an electrode of an object to be inspected, the position adjusting unit comprising:
a position adjusting section that adjusts the tip position of the contactor;
a load detecting section that detects a value of contact load between the contactor and the electrode;
a position deriving section that derives an initial position of the contactor in a specific direction based on a relationship between an amount of contact displacement of the contactor in the specific direction and the value of contact load between the contactor and the electrode; and
a movement performing section that moves the tip position of the contactor based on the initial position in the specific direction derived by the position deriving section,
wherein the position adjusting section adjusts a two dimensional position of the contactor relative to the electrode,
wherein, after the two dimensional position of the contactor is adjusted, the contactor is manually or automatically lowered towards the electrode until the contactor contacts the electrode, thereby causing displacement of the contactor in the specific direction,
wherein the position deriving section obtains at least two or more measurement results, including the amount of contact displacement of the contactor in the specific direction and the value of contact load obtained at the time, and derives the initial position of the contactor in the specific direction using a value of change in load per unit length, which was derived using the two or more measurement results, and
wherein the movement performing section performs a fine adjustment of the tip position of the contactor based on the initial position derived by the position deriving section.

5. The position adjusting unit according to claim 4,
wherein the contactor is a cantilever type contactor, and
wherein the position deriving section derives the initial
position of the contactor in the specific direction based
on a proportional relationship between the amount of
contact displacement of the contactor in the specific
direction and the value of contact load between the
contactor and the electrode.

6. The position adjusting unit according to claim 4,
wherein the position adjusting section adjusts the two
dimensional position of the contactor relative to the
electrode by being manipulated by the operator while
the operator views the electrode through a microscope
or imaging device.

7. A position adjusting method by which a tip position of
a contactor that is brought into electrical contact with an
electrode of an object to be inspected is adjusted by a
position adjusting unit including the contactor, a position
adjusting section that adjusts the tip position of the contactor, and a load detecting section that detects a value of
contact load between the contactor and the electrode, comprising steps of:

a position deriving section deriving an initial position of
the contactor in a specific direction based on a relationship between an amount of contact displacement of
the contactor in the specific direction and the value of
contact load between the contactor and the electrode, the position adjusting section adjusting a two dimensional
position of the contactor relative to the electrode, after adjusting the two dimensional position of the contactor, manually or automatically lowering the contactor towards the electrode until the contactor contacts
the electrode, thereby causing displacement of the
contactor in the specific direction, the position deriving section obtaining at least two or
more measurement results, including the amount of
contact displacement of the contactor in the specific
direction and the value of contact load obtained at the
time, and deriving the initial position of the contactor
in the specific direction using a value of change in load
per unit length, which was derived using the two or
more measurement results, and a movement performing section performing a fine adjustment of the tip position of the contactor based on the
initial position in the specific direction derived by the
position deriving section.

8. The position adjusting method according to claim 7,
wherein the contactor is a cantilever type contactor, and
wherein the step of deriving the initial position of the
contactor in the specific direction includes a step of
deriving the initial position of the contactor in the
specific direction based on a proportional relationship
between the amount of contact displacement of the
contactor in the specific direction and the value of
contact load between the contactor and the electrode.

9. The position adjusting method according to claim 7,
wherein the step of adjusting the two dimensional position
of the contactor relative to the electrode includes a step
of the operator manipulating the position adjusting
section while the operator views the electrode through
a microscope or imaging device.

* * * * *